United States Patent
Nakamura

(10) Patent No.: US 12,007,182 B2
(45) Date of Patent: Jun. 11, 2024

(54) FLOW RATE ABNORMALITY DETECTION DEVICE, COOLING SYSTEM, FLOW RATE ABNORMALITY DETECTION METHOD AND PROGRAM

(71) Applicant: NEC Platforms, Ltd., Kawasaki (JP)

(72) Inventor: Yasuhito Nakamura, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 1235 days.

(21) Appl. No.: 16/491,209

(22) PCT Filed: Mar. 2, 2018

(86) PCT No.: PCT/JP2018/008090
§ 371 (c)(1),
(2) Date: Sep. 5, 2019

(87) PCT Pub. No.: WO2018/164004
PCT Pub. Date: Sep. 13, 2018

(65) Prior Publication Data
US 2020/0064088 A1     Feb. 27, 2020

(30) Foreign Application Priority Data

Mar. 6, 2017   (JP) .................. 2017-041556

(51) Int. Cl.
F28F 27/00       (2006.01)
G06F 1/20        (2006.01)
(Continued)

(52) U.S. Cl.
CPC ............ F28F 27/00 (2013.01); G06F 1/20 (2013.01); H05K 7/20281 (2013.01); *G01F 1/00* (2013.01); *G06F 2200/201* (2013.01)

(58) Field of Classification Search
CPC ...... F28F 27/00; G06F 1/20; G06F 2200/201; H05K 7/20281; H05K 7/20781; H05K 7/20; H05K 7/20272; G01F 1/00
See application file for complete search history.

(56) References Cited

U.S. PATENT DOCUMENTS

| 10,364,809 B2 * | 7/2019 | Lyon ...................... G06F 1/20 |
| 2003/0115000 A1 * | 6/2003 | Bodas .................. G06F 1/26 |
| | | 702/60 |

(Continued)

FOREIGN PATENT DOCUMENTS

| CN | 103597483 A * | 2/2014 | ......... G06F 17/5004 |
| CN | 114779911 A * | 7/2022 | ............... G06F 1/20 |

(Continued)

OTHER PUBLICATIONS

Machine Translation of JP-4610717-B2 (Year: 2011).*
(Continued)

*Primary Examiner* — Mischita L Henson

(57) ABSTRACT

A flow rate abnormality detection device includes: a number determination unit that determines a number of devices to be cooled; a threshold value setting unit that sets a threshold value based on the number of devices to be cooled; and an abnormality determination unit that determines that there is an abnormality when a total flow rate of refrigerant supplied to the devices to be cooled is less than the threshold value.

5 Claims, 4 Drawing Sheets

(51) Int. Cl.
*H05K 7/20* (2006.01)
*G01F 1/00* (2022.01)

(56) References Cited

U.S. PATENT DOCUMENTS

| | | | |
|---|---|---|---|
| 2004/0057211 A1 | 3/2004 | Kondo et al. | |
| 2006/0016901 A1* | 1/2006 | Beitelmal | H05K 7/20209 |
| | | | 236/49.3 |
| 2009/0201645 A1* | 8/2009 | Kashirajima | H05K 7/20827 |
| | | | 165/104.33 |
| 2014/0007698 A1* | 1/2014 | Peczalski | G01F 1/663 |
| | | | 73/861.28 |
| 2014/0343745 A1* | 11/2014 | Slessman | B65D 65/466 |
| | | | 700/297 |
| 2016/0026224 A1 | 1/2016 | Sakurai | |
| 2016/0120059 A1 | 4/2016 | Shedd et al. | |

FOREIGN PATENT DOCUMENTS

| | | | | | |
|---|---|---|---|---|---|
| GB | 2495818 A | * | 4/2013 | | G06F 1/206 |
| JP | S59-153046 A | | 8/1984 | | |
| JP | 2006-229118 A | | 8/2006 | | |
| JP | 2009-217500 A | | 9/2009 | | |
| JP | 4610717 B2 | * | 1/2011 | | F02C 9/46 |
| JP | 2012-230624 A | | 11/2012 | | |
| JP | 2016-029692 A | | 3/2016 | | |
| JP | 2016-031634 A | | 3/2016 | | |
| WO | WO-2012020752 A1 | * | 2/2012 | | F25B 49/00 |

OTHER PUBLICATIONS

Machine Translation of CN-114779911-A (Year: 2022).*
Machine Translation of CN-103597483-A (Year: 2014).*
Khoury et al., "A fast method for the calculation of refrigerant thermodynamic properties in a refrigeration cycle", Jan. 2024, International Journal of Refrigeration, vol. 157, pp. 99-108 (Year: 2024).*
Payne et al., "A Mass Flowrate Correlation for Refrigerants and Refrigerant Mixtures Flowing Through Short Tubes", Jan. 2004, NIST, pp. 1-14 (Year: 2004).*
International Search Report for PCT Application No. PCT/JP2018/008090, dated May 22, 2018.
Extended European Search Report for EP Application No. EP18764189.9 dated Nov. 26, 2020.

* cited by examiner

FIG. 2

| NUMBER OF DEVICES | | | | | |
|---|---|---|---|---|---|
| 1 | 2 | 3 | 4 | ...... | N |

FLOW RATE ABNORMALITY DETECTION DEVICE, COOLING SYSTEM, FLOW RATE ABNORMALITY DETECTION METHOD AND PROGRAM

This application is a National Stage Entry of PCT/JP2018/008090 filed on Mar. 2, 2018, which claims priority from Japanese Patent Application 2017-041556 filed on Mar. 6, 2017, the contents of all of which are incorporated herein by reference, in their entirety.

TECHNICAL FIELD

The present invention relates to a flow rate abnormality detection device, a cooling system, a flow rate abnormality detection method, and a program.

BACKGROUND ART

Several techniques have been proposed for cooling systems, such as water cooling systems.

For example, Patent Document 1 describes an information processing system in which the total flow rate of cooling water is increased or decreased according to the sum of the power consumption of all the servers in the information processing system.

Further, Patent Document 2 describes a cooling system that cools an electronic device by applying a wind including heat generated from the electronic device to an evaporator provided in the vicinity of the electronic device, to vaporize a refrigerant. The cooling system controls the air blowing amount and the cooling processing amount in the evaporator, based on load information of an information processing device.

PRIOR ART DOCUMENTS

Patent Documents

[Patent Document 1] Japanese Unexamined Patent Application, First Publication No. 2016-029692
[Patent Document 2] Japanese Unexamined Patent Application, First Publication No. 2009-217500

SUMMARY OF THE INVENTION

Problem to be Solved by the Invention

Not only control of the cooling system but also abnormality detection is important. In particular, it is preferable that an abnormality can be detected relatively stably.

An exemplary object of the present invention is to provide a flow rate abnormality detection device, a cooling system, a flow rate abnormality detection method, and a program that can solve the above-mentioned problems.

Means for Solving the Problem

According to a first exemplary aspect of the present invention, a flow rate abnormality detection device includes: a number determination unit that determines a number of devices to be cooled; a threshold value setting unit that sets a threshold value based on the number of devices to be cooled; and an abnormality determination unit that determines that there is an abnormality when a total flow rate of refrigerant supplied to the devices to be cooled is less than the threshold value.

According to a second exemplary aspect of the present invention, a flow rate abnormality detection method includes: determining a number of devices to be cooled; setting a threshold value based on the number of devices to be cooled; and determining that there is an abnormality when a flow rate of refrigerant is less than the threshold value.

According to a third exemplary aspect of the present invention, a program is a program that causes a computer to: determine a number of devices to be cooled; set a threshold value based on the number of devices to be cooled; and determine that there is an abnormality when a flow rate of refrigerant is less than the threshold value.

Effect of the Invention

According to the present invention, it is possible to detect an abnormality of the cooling system relatively stably.

BRIEF DESCRIPTION OF THE DRAWINGS

FIG. 2 is a diagram showing an example of cooling water flow rate abnormality determination by an abnormality determiner according to the first exemplary embodiment.

EMBODIMENTS FOR CARRYING OUT THE INVENTION

Hereinafter, exemplary embodiments of the present invention will be described, but the following embodiments do not limit the invention according to the claims. Moreover, not all combinations of features described in the embodiments are essential to the solutions of the invention.

Figure 1:
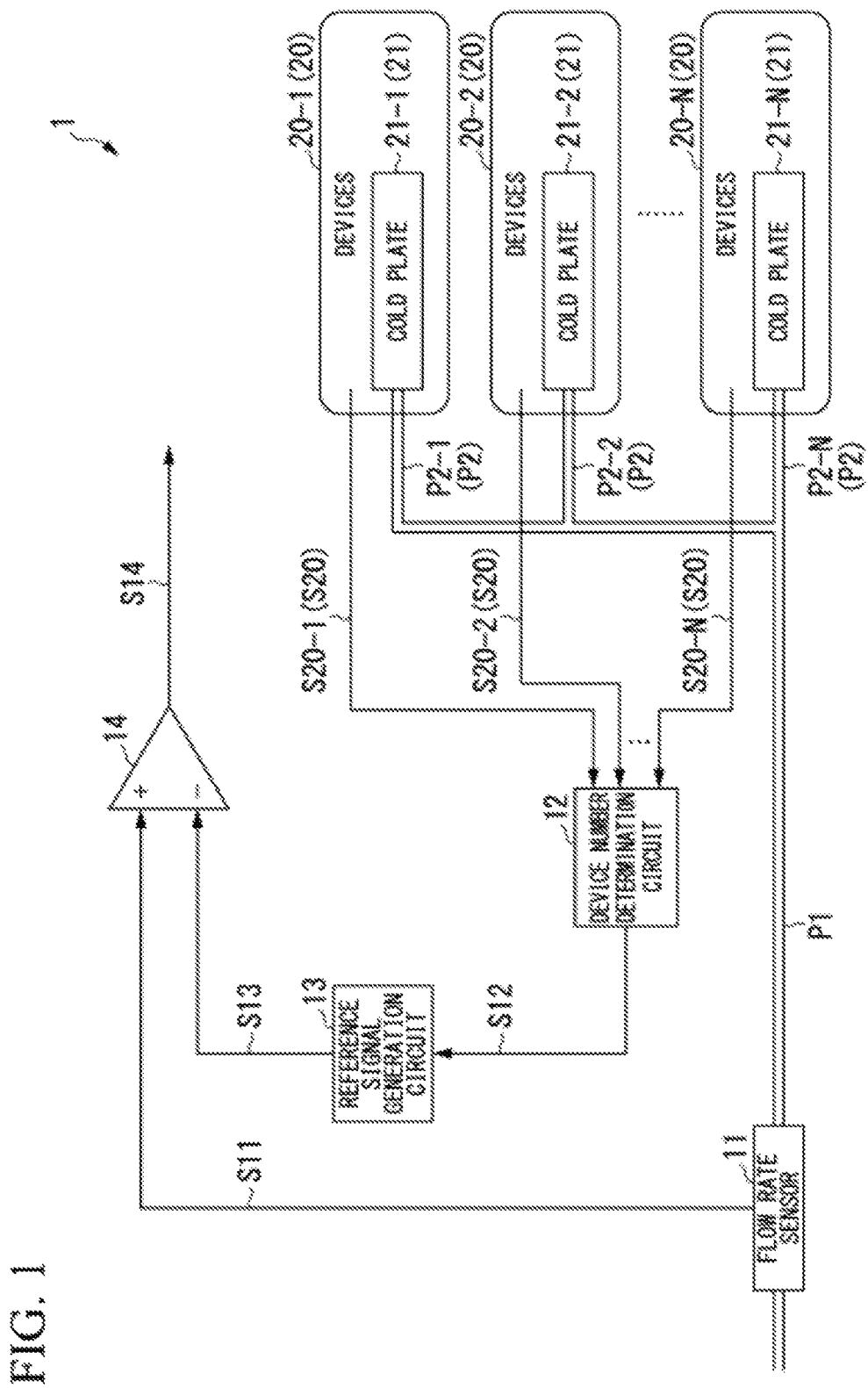
FIG. 1 is a schematic block diagram showing a functional configuration of a cooling system according to a first exemplary embodiment of the present invention.

FIG. 1 is a schematic block diagram showing a functional configuration of a cooling system 1 according to a first exemplary embodiment of the present invention. As shown in FIG. 1, a cooling system 1 includes; a flow rate sensor 11, a device number determination circuit (determination circuit) 12, a reference signal generation circuit (generation circuit) 13, and an abnormality determiner (abnormality determination unit) 14. The cooling system 1 is further provided with devices 20-1 to 20-N, a cooling water main piping P1, cooling water branch piping P2-1 to P2-N, a flow rate signal path S11, a reference instruction signal path S12, an abnormality detection reference signal path S13, a flow rate abnormal signal path S14, and device connection signal paths S20-1 to S20-N. The devices 20-1 to 20-N include cold plates 21-1 to 21-N.

The devices 20 may be included in part of the cooling system 1 or may be configured outside the cooling system 1.

The cooling system 1 supplies cooling water to the N devices 20-1 to 20-N to be cooled, to thereby cool the devices 20-1 to 20-N. Here, N is a positive integer and indicates the number of devices to be cooled by the cooling system 1. Hereinafter, the devices 20-1 to 20-N will be collectively referred to as devices 20. Further, the cooling system 1 detects a flow rate abnormality of the cooling water. The cooling system 1 corresponds to an example of a flow rate abnormality detection device.

However, the refrigerant used for cooling by the cooling system 1 is not limited to cooling water, and may be any refrigerant whose flow rate can be measured.

The cold plates 21-1 to 21-N are attached to the N devices 20-1 to 20-N, respectively. The cold plates 21-1 to 21-N are installed near heat sources in the devices 20-1 to 20-N, for example, high heat generation electronic devices in the devices 20-1 to 20-N. Hereinafter, the cold plates 21-1 to 21-N will be collectively referred to as cold plates 21.

The cooling system 1 supplies cooling water to the cold plates 21-1 to 21-N in order to cool the devices 20-1 to 20-N. The cooling water supplied from a cooling water supply source is distributed to the cooling water branch pipes P2-1 to P2-N after passing through the cooling water main pipe P1, and flows to the cold plates 21-1 to 21-N. Hereinafter, the cooling water branch pipes P2-1 to P2-N are collectively referred to as a cooling water branch pipes P2.

The flow rate sensor 11 is provided in the cooling water main pipe P1 and detects the flow rate of the cooling water flowing through the cooling water main pipe P1. The flow rate sensor 11 outputs a flow rate signal indicating the detected flow rate, to the abnormality determiner 14 via the flow rate signal path S11.

The flow rate sensor 11 may output a signal of a current value proportional to the flow rate of the cooling water flowing through the cooling water main pipe P1. In this case, the flow rate of the cooling water flowing through the cooling water main pipe P1 corresponds to an example of the total flow rate of refrigerant supplied to the devices 20. The flow rate sensor 11 in this case corresponds to an example of a flow rate detection unit.

The flow rate sensor 11 may output a signal of a voltage value proportional to the flow rate of the cooling water flowing through the cooling water main pipe P1. In this case, the flow rate of the cooling water flowing through the cooling water main pipe P1 corresponds to an example of the total flow rate of refrigerant supplied to the devices 20. The flow rate sensor 11 in this case corresponds to an example of a flow rate detection unit.

Alternatively, the flow rate sensor 11 may output a digital signal indicating the flow rate of the cooling water flowing through the cooling water main pipe P1.

Each of the devices 20-1 to 20-N, and the device number determination circuit 12 are connected via device connection signal paths S20-1 to S20-N. Hereinafter, the device connection signal paths S20-1 to S20-N will be collectively referred to as device connection signal paths S20.

Each of the devices 20-1 to 20-N outputs a device connection signal to the device number determination circuit 12 via the device connection signal paths S20-1 to S20-N.

The device number determination circuit 12 determines (counts) the number of devices 20 that receive the supply of cooling water, by counting the number of device connection signals output from the devices 20. The device number determination circuit 12 corresponds to an example of a number determination unit. The number of device connection signals output from the devices 20 may mean the number of devices 20 that have output device connection signals. When only some of the devices 20-1 to 20-N are operating, the cooling water may be supplied only to the operating devices among the devices 20-1 to 20-N. In this case, only the devices 20 in operation output a device connection signal, and the device number determination circuit 12 determines the number of devices 20 in operation.

The method of supplying cooling water only to the devices 20 in operation is not limited to a specific method. For example, a shutoff valve may be provided in each of the cooling water branch pipes P2, and only the shutoff valve provided in the cooling water branch pipe P2 to the device 20 in operation that has output the device connection signal may be opened. Alternatively, only the device 20 in operation may circulate cooling water to allow fresh cooling water to flow into the device 20 itself.

The device number determination circuit 12 outputs a reference instruction signal indicating the number of devices 20 detected in the determination, to the reference signal generation circuit 13 via the reference instruction signal path S12.

The device number determination circuit 12 may output a reference instruction signal of a current value proportional to the number of the devices 20 detected. The device number determination circuit 12 may output a reference instruction signal of a voltage value proportional to the number of the devices 20 detected. Alternatively, the device number determination circuit 12 may output a reference instruction signal as a digital signal indicating the number of devices 20 detected.

The reference signal generation circuit 13 calculates a determination threshold value of cooling water flow rate abnormality based on the number of devices 20 indicated by the reference instruction signal. The reference signal generation circuit 13 corresponds to an example of a threshold value setting unit.

For example, the cooling water flow rate per unit device 20 may be predetermined by a constant. In this case, the reference signal generation circuit 13 multiplies the cooling water flow rate per unit device 20 by the number of the devices 20 to calculate the determination threshold value. The reference signal generation circuit 13 outputs an abnormality detection reference signal indicating the calculated determination threshold value, to the abnormality determiner 14 via the abnormality detection reference signal path S13.

The reference signal generation circuit 13 may be configured using a current amplification circuit, and output a signal of a current value obtained by multiplying a predetermined current value by the number of devices 20. The reference signal generation circuit 13 may be configured using a voltage amplification circuit, and output a signal of a voltage value obtained by multiplying a predetermined voltage value by the number of devices 20. Alternatively, the reference signal generation circuit 13 may output a digital signal indicating the flow rate obtained by multiplying a predetermined flow rate by the number of devices 20, as an abnormality detection reference signal.

The abnormality detection reference signal is set to a signal indicating a flow rate for cooling the temperature of the devices 20 to a temperature less than a temperature at which a temperature abnormality does not occur.

The abnormality determiner 14 compares the cooling water flow rate measurement value detected by the flow rate sensor 11, with the determination threshold value calculated by the reference signal generation circuit 13. If it is determined that the cooling water flow rate measurement value is smaller than the determination threshold value, the abnormality determiner 14 outputs a flow rate abnormality signal indicating a cooling water flow rate abnormality, to the flow rate abnormality signal path S14. The abnormality determiner 14 corresponds to an example of an abnormality determination unit.

When the flow rate sensor 11 outputs a flow rate signal of a current value corresponding to the measured flow value, and the reference signal generation circuit 13 outputs an abnormality detection signal of a current value corresponding to the size of the threshold value, the abnormality determiner 14 makes an abnormality judgment by comparing the magnitude of these currents. Specifically, when the magnitude of the current of the signal output from the flow rate sensor 11 is smaller than the magnitude of the current of the signal output from the reference signal generation circuit 13, the abnormality determiner 14 determines that there is an abnormality.

When the flow rate sensor 11 outputs a flow rate signal of a voltage value corresponding to the flow rate measurement value, and the reference signal generation circuit 13 outputs an abnormality detection signal of a voltage value according to the size of threshold value, the abnormality determiner 14 makes an abnormality judgment by comparing the magnitude of these voltages. Specifically, when the magnitude of the voltage of the signal output from the flow rate sensor 11 is smaller than the magnitude of the voltage of the signal output from the reference signal generation circuit 13, the abnormality determiner 14 determines that there is an abnormality.

Alternatively, the abnormality determiner 14 may compare the measured flow value of the flow rate sensor 11 with a threshold value set by the reference signal generation circuit 13 by software processing.

For example, when a host device or an alarm panel receives a flow rate abnormality signal and displays an alarm, the user can recognize the occurrence of the cooling water flow rate abnormality, and can perform inspection, repair, and the like.

Figure 2:
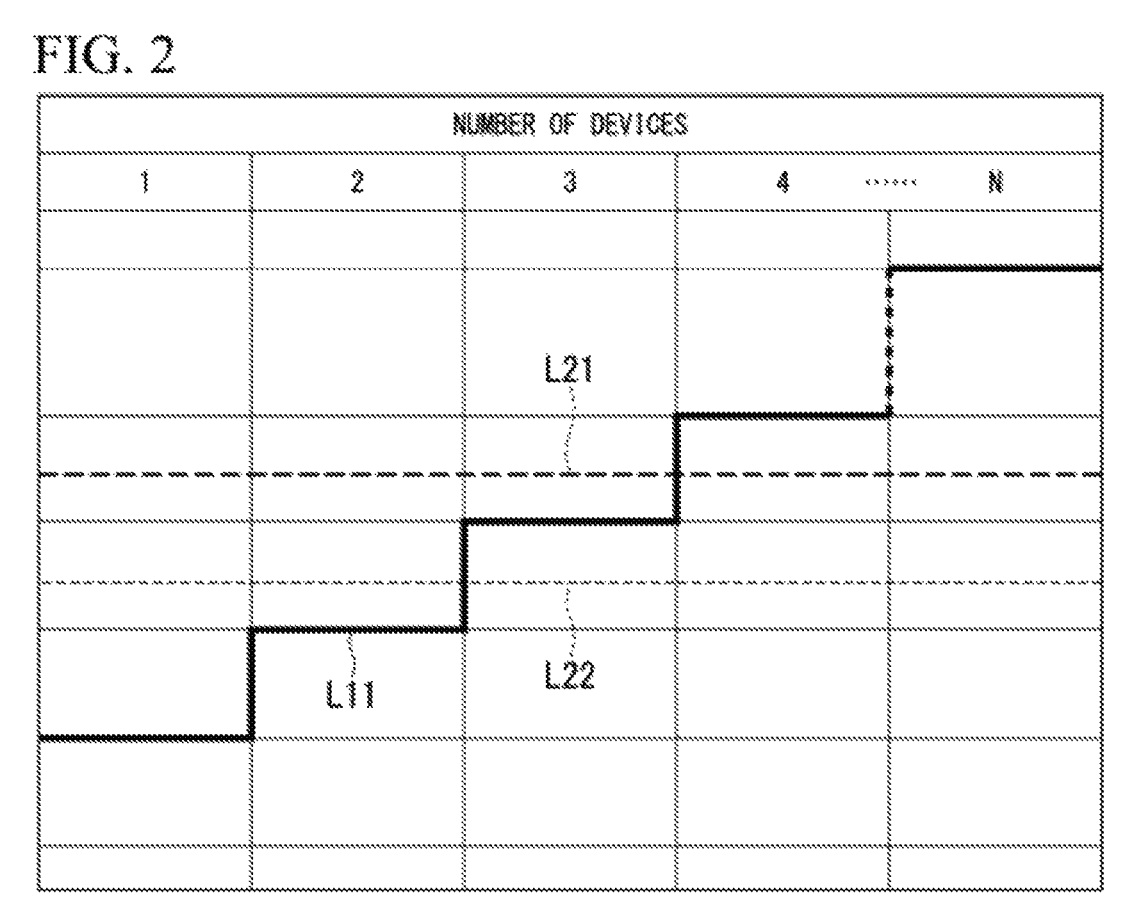

FIG. 2 is a diagram showing an example of cooling water flow rate abnormality determination by the abnormality determiner 14. Line L11 in FIG. 2 shows the respective determination threshold values for the case where the number of devices 20 that receive the supply of cooling water is one, two, three, four, . . . , N.

Line L21 shows a first example of a cooling water flow rate measurement value. Line L21 shows an example for a case where the number of devices 20 receiving the supply of cooling water is three. The cooling water flow rate measurement value indicated by the line L21 is a value equal to or more than the determination threshold value for when the number of the devices 20 is three. Thus, the abnormality determiner 14 determines that the cooling water flow rate is normal.

Line L22 shows a second example of the cooling water flow rate measurement value. Line L22 shows an example for a case where the number of devices 20 receiving the supply of cooling water is three, and the cooling water flow rate measurement value indicated by line L22 is a value smaller than the determination threshold value for when the number of the devices 20 is three. Thus, the abnormality determiner 14 determines that the cooling water flow rate is abnormal.

As described above, the device number determination circuit 12 determines the number of devices 20. The reference signal generation circuit 13 sets a threshold value based on the number of devices 20. When the flow rate of refrigerant is smaller than the threshold value, the abnormality determiner 14 determines that there is an abnormality.

As described above, the reference signal generation circuit 13 sets the threshold value based on the number of devices 20. Thereby the threshold value can be set automatically, and a setting error by hand can be avoided. In this respect, the cooling system 1 can detect an abnormality of the cooling system relatively stably.

Further, the flow rate sensor 11 outputs a signal of a current value proportional to the total flow rate of refrigerant supplied to the devices 20. The reference signal generation circuit 13 outputs a signal of a current value obtained by multiplying the predetermined current value by the number of devices 20. If the magnitude of the current of the signal output from the flow rate sensor 11 is smaller than the magnitude of the current of the signal output from the reference signal generation circuit 13, the abnormality determiner 14 determines that there is an abnormality.

As described above, the abnormality determiner 14 determines the presence or absence of an abnormality by comparing the magnitudes of the currents, so that the determination can be performed by hardware processing without requiring software processing. Since the abnormality determiner 14 does not require software processing, it is possible to avoid a situation in which abnormality monitoring can not be performed due to a freeze or the like of a processor that operates the software.

Also for the setting of the threshold value, the reference signal generation circuit 13 can set the threshold value by hardware processing without requiring software processing. Since the reference signal generation circuit 13 does not require software processing, it is possible to avoid a situation where the threshold value is not set due to a freeze or the like of a processor that operates the software, and a situation where the abnormality determiner 14 can not perform abnormality monitoring.

Moreover, the flow rate sensor 11 outputs a signal of a voltage value proportional to the total flow rate of refrigerant supplied to the devices 20. The reference signal generation circuit 13 outputs a signal of a voltage value obtained by multiplying a predetermined voltage value by the number of devices 20. The abnormality determiner 14 determines that there is an abnormality if the magnitude of the voltage of the signal output from the flow rate sensor 11 is smaller than the magnitude of the voltage of the signal output from the reference signal generation circuit 13.

As described above, the abnormality determiner 14 determines the presence or absence of an abnormality by comparing the magnitudes of the voltages, so that the determination can be performed by hardware processing without requiring software processing. Since the abnormality determiner 14 does not require software processing, it is possible to avoid a situation in which abnormality monitoring can not be performed due to a freeze or the like of a processor that operates the software.

Also for the setting of the threshold value, the reference signal generation circuit 13 can set the threshold value by hardware processing without requiring software processing. Since the reference signal generation circuit 13 does not require software processing, it is possible to avoid a situation where the threshold value is not set due to a freeze or the like of a processor that operates the software, and a situation where the abnormality determiner 14 can not perform abnormality monitoring.

The cooling system may determine a flow rate abnormality using a flow switch provided for each device to be cooled. This point will be described with reference to FIG. 3.

Figure 3:
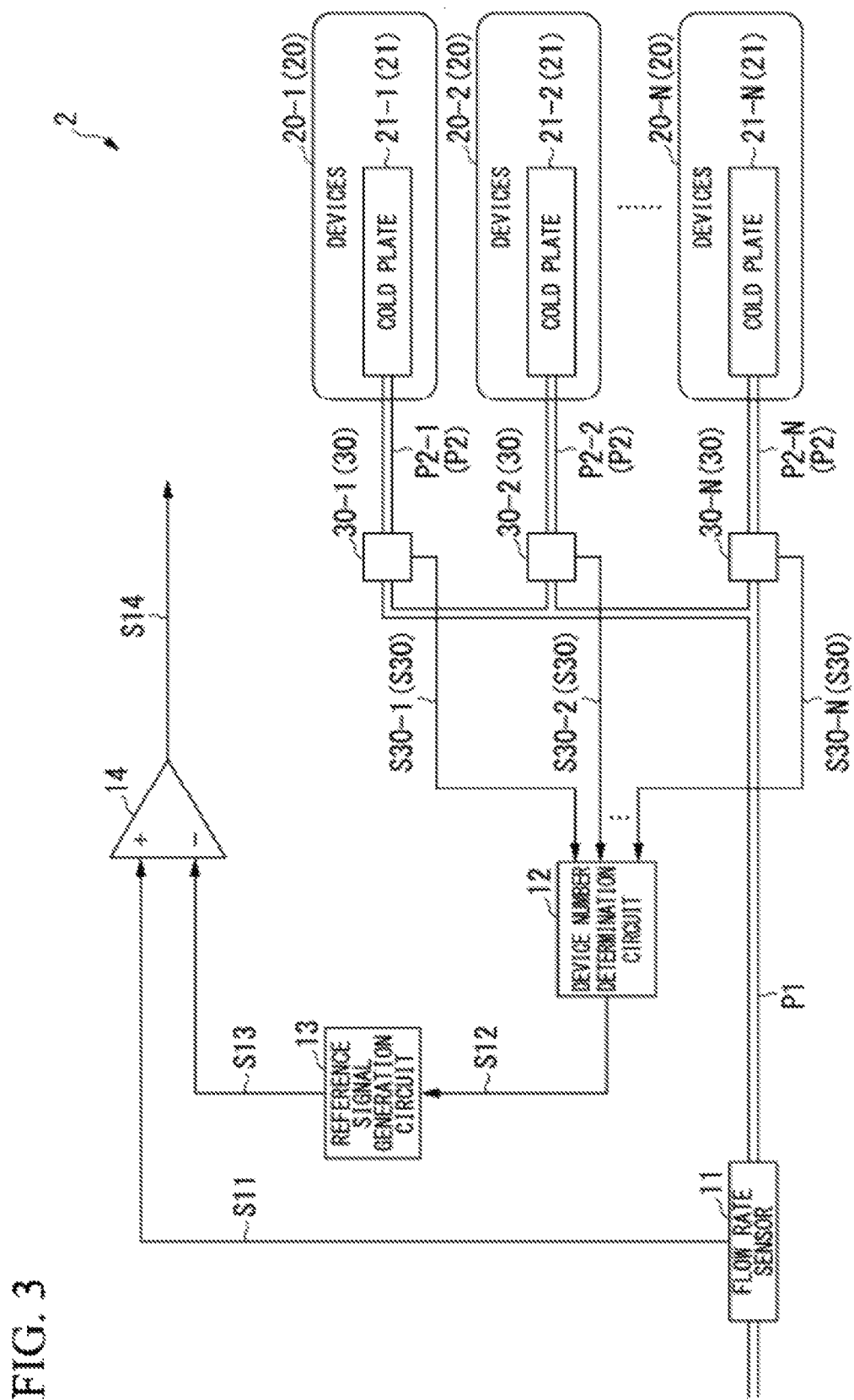
FIG. 3 is a schematic block diagram showing a functional configuration of a cooling system in a case where a flow switch is provided for each device to be cooled in the first exemplary embodiment.

FIG. 3 is a schematic block diagram showing a functional configuration of a cooling system in the case where a flow switch is provided for each device to be cooled. As shown in FIG. 3, a cooling system 2 includes; a flow rate sensor 11, a device number determination circuit 12, a reference signal generation circuit 13, an abnormality determiner 14, devices 20, flow switches 30-1 to 30-N, a cooling water main pipe P1, cooling water branch pipes P2, a flow rate signal path S11, a reference instruction signal path S12, an abnormality detection reference signal path S13, a flow rate abnormality signal path S14, and device connection signal paths S30-1 to S30-N. The devices 20 comprise cold plates 21.

As in the case of FIG. 1, the devices 20 may be included in part of the cooling system 2, or may be configured outside the cooling system 2.

Among the components in FIG. 3, the components having the same functions as those in FIG. 1 have the same reference numerals (11, 12, 13, 14, 20, 20-1 to 20-N, 21, 21-1 to 21-N, P1, P2, P2-1 to P2-N, S11, S12, S13, and S14), and their description will be omitted.

The cooling system 2 is different from the configuration of the cooling system 1 in that flow switches 30-1 to 30-N are provided in the cooling water branch pipes P2-1 to P2-N, respectively. Further, the cooling system 2 differs from the configuration of the cooling system 1 in that instead of the device connection signal paths S20-1 to S20-N, the device connection signal paths S30-1 to S30-N are connected to each of the flow switches 30-1 to 30-N and to the device number determination circuit 12. Hereinafter, the flow switches 30-1 to 30-N will be collectively referred to as flow switches 30. The device connection signal paths S30-1 to S30-N will be collectively referred to as device connection signal paths S30.

When the flow switches 30-1 to 30-N detect that cooling water having a flow rate equal to or more than a predetermined value (predetermined amount) flows in the cooling water branch pipes P2-1 to P2-N, respectively, a device connection signal is output to the number of devices determination circuit 12. For example, the flow switches 30-1 to 30-N transition from the OFF state to the ON state when the flow rate of the cooling water flowing through each of the cooling water branch pipes P2-1 to P2-N becomes equal to or more than a predetermined value, respectively, and output the device connection signal. Moreover, the flow switches 30-1 to 30-N transition from the ON state to the OFF state when the flow rate of the cooling water flowing through the cooling water branch pipes P2-1 to P2-N is less than a predetermined value, respectively, and output of the device connection signal stops.

The device number determination circuit 12 counts the number of devices 20 by counting the number of device connection signals S30 instead of the number of device connection signal paths S20.

As described above, the flow switches 30 are provided in the cooling water branch pipes P2, which are flow paths to each of the devices 20, and detect refrigerant flow rates equal to or more than a predetermined flow rate. The device number determination circuit 12 counts the number of flow switches that have detected a refrigerant flow rate equal to or more than a predetermined flow rate.

As a result, the cooling system 2 can detect an abnormal flow rate of the cooling water without the need for each of the devices 20 to have a mechanism for outputting a device connection signal, and the devices 20 can be black boxed. The cooling system 2 enables configuration of the system more easily, in that no modification to the devices 20 is required.

Next, a second exemplary embodiment of the present invention will be described with reference to FIG. 4.

Figure 4:
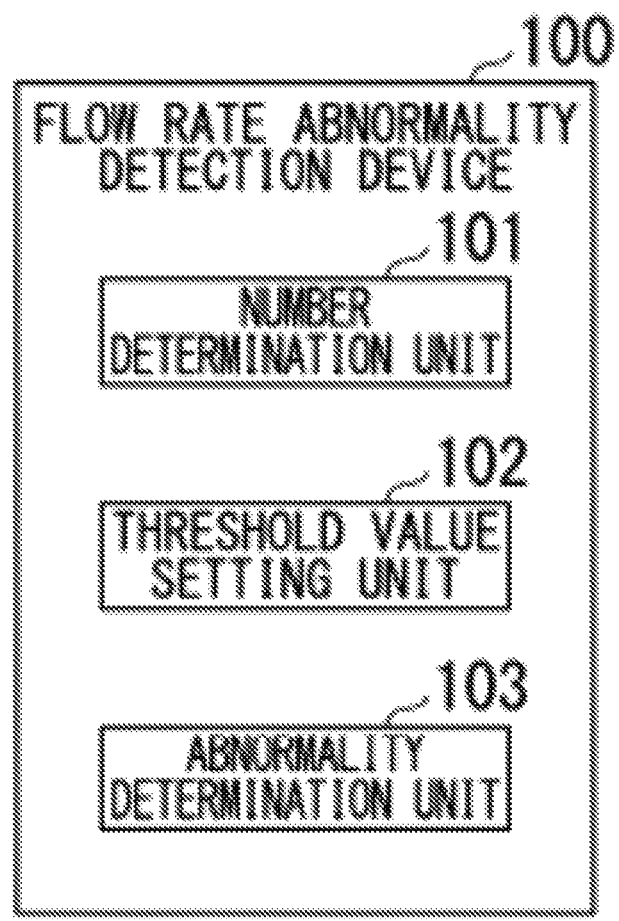
FIG. 4 is a diagram showing an example of a flow rate abnormality detection device according to a second exemplary embodiment of the present invention.

FIG. 4 is a diagram showing an example of a flow rate abnormality detection device according to a second exemplary embodiment of the present invention. The flow rate abnormality detection device 100 illustrated in FIG. 4 includes a number determination unit 101, a threshold value setting unit 102, and an abnormality determination unit 103.

With such a configuration, the number determination unit 101 determines the number of devices to be cooled. The threshold value setting unit 102 sets a threshold value based on the number of devices to be cooled. When the total flow rate of refrigerant supplied to the devices to be cooled is smaller than the threshold value, the abnormality determination unit 103 determines that there is an abnormality.

As described above, the threshold value setting unit 102 sets the threshold value based on the number of devices to be cooled. Thereby the threshold value can be set automatically, and a setting error by hand can be avoided. In this respect, the flow rate abnormality detection device 100 can detect an abnormality of the cooling system relatively stably.

A program for realizing all or a part of the processing in the cooling system 1, the cooling system 2, and the flow rate abnormality detecting devices 100 may be recorded in a computer readable recording medium, and the program recorded in the recording medium may be read into a computer system and executed. Here, the "computer system" includes an OS and hardware such as peripheral devices.

Moreover, the "computer-readable recording medium" includes portable media such as a flexible disk, a magneto-optical disk, a ROM, and a CD-ROM, and a storage device such as a hard disk built in a computer system. Furthermore, the program may be for realizing a part of the functions described above, or may be realized in combination with a program already recorded in the computer system.

Exemplary embodiments of the present invention have been described in detail with reference to the drawings. However, the specific configurations are not limited to the embodiments, and include designs and the like that fall within a scope that does not depart from the gist of this invention.

This application claims priority based on Japanese Patent Application No. 2017-041556 filed Mar. 6, 2017, the entire disclosure of which is incorporated herein.

INDUSTRIAL APPLICABILITY

The present invention may be applied to a flow rate abnormality detection device, a cooling system, a flow rate abnormality detection method, and a program.

REFERENCE SYMBOLS 1, 2 Cooling system
11 Flow rate sensor
12 Device number determination circuit
13 Reference signal generator
14 Abnormality determiner
20 Devices
21 Cold plate
30 Flow switch
100 Flow rate abnormality detection device
101 Number determination unit
102 Threshold value setting unit
103 Abnormality determination unit
P1 Cooling water main pipe
P2 Cooling water branch pipe
S11 Flow rate signal path
S12 Reference instruction signal path
S13 Abnormality detection reference signal path
S14 Flow rate abnormality signal path
S20, S30 Device connection signal path

What is claimed is:

1. A flow rate abnormality detection device comprising:
a memory configured to store instructions;
a processor configured to execute the instructions to determine a number of devices to be cooled;
a flow rate detector configured to output a first signal of a first current value proportional to a total flow rate of refrigerant supplied to the devices to be cooled; and
a circuit configured to output a second signal of a second current value for determining whether the total flow rate is abnormal, based on the number of devices to be cooled,
wherein the processor is configured to execute the instructions to determine that the total flow rate is abnormal when a magnitude of the first current value is smaller than a magnitude of the second current value,
wherein the circuit is configured to multiply a refrigerant flow rate per device to be cooled by the number of the devices to be cooled to calculate a threshold value,
and wherein the refrigerant flow rate per device to be cooled is a predetermined constant, and the second signal indicates the threshold value.

2. The flow rate abnormality detection device according to claim 1, further comprising:
a flow switch which is provided in a flow path to each of the devices to be cooled and is configured to detect whether a refrigerant flow has a rate equal to or more than a predetermined flow rate, and
wherein the processor is configured to execute the instructions to count a number of flow switches that have detected a refrigerant flow rate equal to or more than the predetermined flow rate.

3. A cooling system comprising the flow rate abnormality detection device according to claim 1.

4. A flow rate abnormality detection method comprising:
determining a number of devices to be cooled;
outputting, by a flow rate detector, a first signal of a first current value proportional to a total flow rate of refrigerant supplied to the devices to be cooled;
outputting, by a circuit, a second signal of a second current value for determining whether the total flow rate is abnormal, based on the number of devices to be cooled;
determining that the total flow rate is abnormal when a magnitude of the first current value is smaller than a magnitude of the second current value; and
multiplying, by the circuit, a refrigerant flow rate per device to be cooled by the number of the devices to be cooled to calculate a threshold value,
wherein the refrigerant flow rate per device to be cooled is a predetermined constant, and the second signal indicates the threshold value.

5. The flow rate abnormality detection device according to claim 1, further comprising:
a flow rate sensor that is provided in a main pipe through which the refrigerant supplied to the devices to be cooled flows and is configured to detect the total flow rate of the refrigerant supplied to the devices to be cooled.

* * * * *